(12) United States Patent
Sheng et al.

(10) Patent No.: US 8,618,872 B1
(45) Date of Patent: Dec. 31, 2013

(54) FILTER WITH CONTROLLED CUT-OFF FREQUENCY STEP-DOWN

(75) Inventors: Hongying Sheng, San Jose, CA (US); Jun Wang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 1331 days.

(21) Appl. No.: 11/367,777

(22) Filed: Mar. 3, 2006

Related U.S. Application Data

(60) Provisional application No. 60/724,361, filed on Oct. 6, 2005.

(51) Int. Cl.
*H03B 1/00* (2006.01)
*H03K 5/00* (2006.01)
*H04B 1/10* (2006.01)
*G06G 7/19* (2006.01)

(52) U.S. Cl.
USPC ........... 327/552; 327/335; 327/553; 327/554; 327/557; 327/559

(58) Field of Classification Search
USPC .......................... 327/552–554, 557, 559, 335
See application file for complete search history.

(56) References Cited

U.S. PATENT DOCUMENTS

| | | | | |
|---|---|---|---|---|
| 6,097,244 A | * | 8/2000 | Chen | 327/553 |
| 6,559,714 B2 | * | 5/2003 | Park et al. | 327/553 |
| 7,019,586 B2 | * | 3/2006 | Dong | 327/553 |
| 7,053,719 B2 | * | 5/2006 | Steinbach et al. | 331/16 |

* cited by examiner

*Primary Examiner* — Lincoln Donovan
*Assistant Examiner* — Colleen O Toole

(57) ABSTRACT

A filter network having a variable cut-off frequency can be controlled in a way that allows the cut-off frequency to be changed gradually to avoid undesirable transient effects. An impedance network (such as a resistor network) that provides a plurality of impedance values is provided. Logic, and a corresponding method, are provided to change the impedance value gradually, such as on a step-wise basis, to change the cut-off frequency gradually. The size of the impedance step and the duration of the step can be preprogrammed, and may be different for different types of events that trigger the need for a frequency change. It may also be possible for those preprogrammed values to be initial values only, with the values changing under programmed control during the frequency changing process. Other values, such as the initial and target impedance values that determine the initial and target frequency, also may be programmable.

42 Claims, 16 Drawing Sheets

FILTER WITH CONTROLLED CUT-OFF FREQUENCY STEP-DOWN

CROSS REFERENCE TO RELATED APPLICATION

This claims the benefit of copending U.S. Provisional Patent Application No. 60/724,361, filed Oct. 6, 2005, which is hereby incorporated by reference herein in its entirety.

BACKGROUND OF THE INVENTION

This invention relates to a filter, and a method of operating a pass filter, in which the cut-off frequency can be stepped down gradually.

High-pass filters with variable cut-off frequency are well-known. For example, a high-pass filter may include a capacitor in line with the signal being filtered, and a resistance between that capacitor and ground. A variable high-pass filter of that type may have several resistances in parallel, each capable of being switched in or out of the circuit. The cut-off frequency is determined by which of the resistors is switched in.

It has been observed that under certain conditions, changing the resistance abruptly to change the set cut-off frequency can cause undesirable transient effects. For example, such a filter may be used as an input filter network on the data or servo channel of a disk drive controller. It has been observed that changing the cut-off frequency abruptly can give rise to false signals. In the case of a disk drive controller, this is particularly the case when operating in perpendicular recording mode.

It would be desirable to be able to change the cut-off frequency of a filter without giving rise to false signals.

SUMMARY OF THE INVENTION

In accordance with the present invention, when it is necessary to change the cut-off frequency of a high-pass filter (or the lower limit of the passband of a bandpass filter) in an application where an abrupt change would give rise to false signals, the frequency is changed gradually instead. In particular, the frequency is changed in steps. In a preferred embodiment, both the step length and step size are predetermined, preferably by user programming, and preferably remain fixed during any particular step-down operation. However, it is also possible that either or both of the step length and the step size can be adjusted during the frequency step-down process.

In the case, for example, of a disk drive controller, a high-pass filter might be provided on the data channel to decouple DC voltage coming from the pre-amplifier, allowing the channel to have a much wider common mode input range without adding a lot of complex circuitry. The high-pass filter also can be used for filtering out low-frequency noise if there is not much signal energy below the given cut-off frequency. In extreme cases, the high-pass filter, which functions like a differentiator, can be used to perform a differentiating function on the input signal. This is particularly the case when the input signal, which may include either "ordinary" data or servo data, is servo data.

Some of the reasons why it might be necessary to change the cut-off frequency of the high-pass filter include:
1. The need to quickly dissipate charge that has built up on the capacitor of the filter during a transient event such as a thermal asperity (TA) event in a disk drive;
2. A need, or desire, to discontinue heavy filtering of the data channel input during a write operation;
3. A desire to allow additional differentiation of the signal during servo mode; and
4. A desire to allow junk information that has built up on the capacitor between consecutive read or servo gates to be discharged quickly—e.g., during auto-zero periods.

It has been found that decreasing the cut-off frequency abruptly may itself cause a transient event similar to a TA event (one of the very reasons that the frequency may need to be reduced). This may occur because charge stored on the capacitor can not be changed instantaneously. Instead, it takes a finite time interval for the capacitor to charge or discharge, as a function of the time constant associated with the capacitor.

Thus, when the cut-off frequency is changed, some time is needed to fully charge or discharge the capacitor. If there is signal energy that is being filtered during that time, the channel for which the filter serves as an input network may see a step response during that time. When switching from a high cut-off frequency to a low cut-off frequency in the presence of a signal having low-frequency content, such as in perpendicular mode recording, the problem may become even worse, because the resulting large input step may be followed by a long settling time. Not only will this inherently cause bit error rate degradation by cutting into the input signal range, but it also may trigger a false TA event which could further degrade the performance of the channel.

In accordance with the invention, the high-pass filter cut-off frequency can be switched gradually. Normally, it will be desired to decrease the cut-off frequency from high to low. The filter cut-off frequency is directly proportional to both the resistance of the filter resistor and the capacitance of the filter capacitor. Preferably, the invention allows the high-pass filter resistor value to be gradually reduced stepwise, with a resulting corresponding reduction in cut-off frequency. However, it is equally within the invention to reduce the cut-off frequency by reducing the filter capacitance. In addition, although the discussion focuses on a high-pass filter, the same considerations come into play when reducing the lower limit of the passband of a bandpass filter, and the invention may be applied there as well.

In the preferred embodiments, frequency is controlled by controlling resistance (or other impedance), which preferably is digitally controlled. Thus, what is preferably adjusted according to the invention is a control variable that controls the resistance. The difference between two adjacent steps as that variable is changed may be referred to as the step size. (One mechanism for converting the control variable to actual resistance or impedance is shown below.) The duration of each step, characterized as a number of clock cycles, may be referred to as the step length. Preferably, step size and step length can be varied by user program control and may differ for different types of trigger events. However, during a particular frequency shifting operation, step size and step length preferably do not change. Nevertheless, it would be within the invention to have one or both of step size and step length change during a frequency shifting operation. For example, to avoid the problems caused by abrupt changes, it may be more important for the initial steps to be of relatively small size and relatively long duration, but as the frequency approaches the target frequency, it may be possible to allow the step size to increase or the step length to decrease, or both.

Therefore, in accordance with the present invention, there is provided a method for varying cut-off frequency of a filter from an initial frequency to a final frequency. The method includes setting a frequency step, setting a step length, detecting a trigger event, and maintaining the cut-off frequency at the initial frequency for a predetermined period after the trigger event. After the predetermined period, the cut-off frequency is changed by the frequency step to an intermediate frequency, the intermediate frequency is maintained for an interval equal to the step length, and after that interval, the intermediate frequency is compared to the final frequency. When the intermediate frequency is between the initial frequency and the final frequency, the changing, the maintaining and the comparing are repeated; otherwise, the cut-off frequency is set to the final frequency.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-8.

Figure 1:
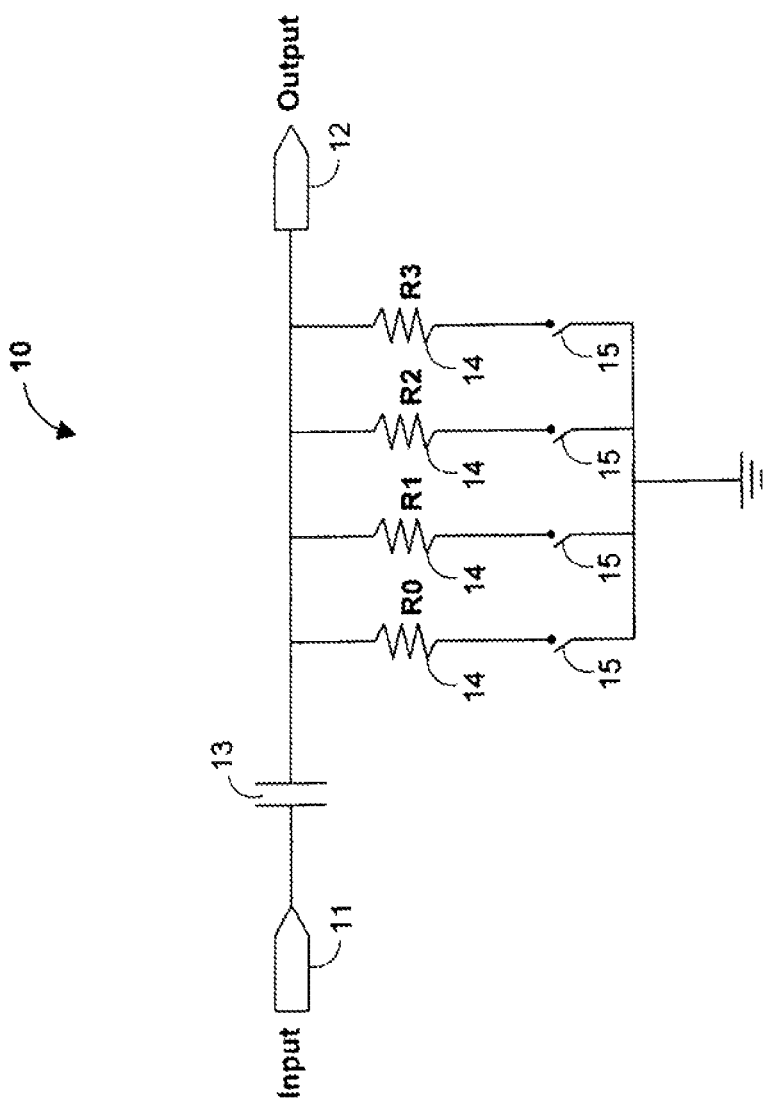
FIG. 1 is a schematic diagram of a known high-pass filter.

FIG. 1 shows an example of a previously known high-pass filter 10 having a variable cut-off frequency. Filter 10 has an input at 11 and an output at 12. A capacitor 13 is in-line between input 11 and output 12, and a plurality of resistors 14 are switchably connected in parallel between output 12 and ground. Closing one or more of switches 15 selects the corresponding one or more of resistors 14 to determine the cut-off frequency of filter 10, which, as is well known, is a function of the capacitance of capacitor 13 and the resistance of the selected resistor 14.

As discussed above, when the filter cut-off frequency is changed abruptly, the change may give rise to undesirable transient effects. This is particularly the case when the cut-off frequency is being decreased, because of the inability of the capacitor to discharge instantaneously. Therefore, in accordance with the present invention, the cut-off frequency may be decreased more gradually.

In particular, in a method according to the present invention, the cut-off frequency is decreased in small steps. In the discussion that follows, this step-wise frequency decrease is described as being accomplished by a step-wise decrease in the resistance (or other impedance), although the invention would apply equally to step-wise decrease of the capacitance.

In a preferred embodiment of the method according to the invention, the high-pass filter resistor value (i.e., the control variable that sets the resistance value) can be gradually reduced step-by-step. The difference between the values of the control variable at two adjacent steps may be defined as the step size. The duration of each step in terms of number of clock cycles may be defined as the step length. Step size and step length may be user programmable values, and each may be different for different types of trigger events. Preferably, however, as discussed above, during a particular frequency reduction operation caused by a particular individual trigger event, the step size and step length will remain fixed. Nevertheless, it is also possible that the step size and step length can change (preferably in a predetermined way or under deliberate program control) even from step to step within a particular frequency reduction operation, as discussed above.

Figure 2:
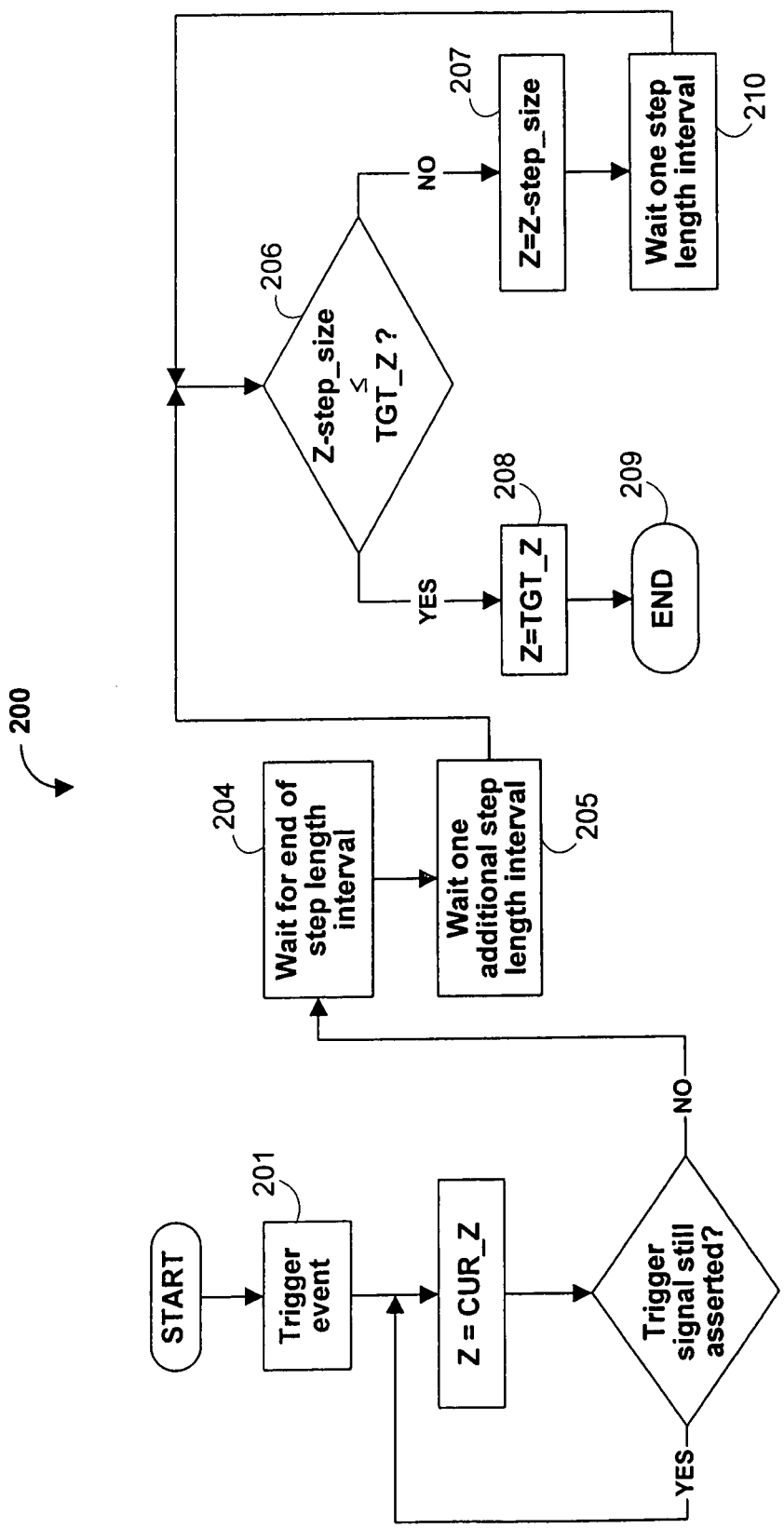
FIG. 2 is a flow diagram illustrating a preferred embodiment of a method according to the present invention.

In a preferred embodiment 200, illustrated in the flow diagram of FIG. 2, on occurrence of a trigger event 201, such as a thermal asperity in the case of a disk drive controller, the resistor control value, which may be referred to as Z, is set at step 202 to a relatively high value, referred as CUR_Z (current resistance), which actually increases the cut-off frequency temporarily to reduce the effect of the transient event, and this higher value of Z preferably is maintained during trigger event signal assertion, as determined at test 203, and preferably extended at step 204 at least up to the end of the step length interval during which the actual trigger event ends. The higher value, CUR_Z, of Z is preferably further maintained, at optional step 205, for one step length beyond the end of the trigger event assertion. At that time, the value of Z should be reduced, but as stated above, reducing the value of Z abruptly to its original value can itself cause another trigger event.

Therefore, at the time that the value of Z is to be reduced, and after testing at test 206 to make sure that Z-step_size is not less than or equal to the target value, TGT_Z, the value of Z preferably is reduced at step 207 to the next value, which the first time, when Z=CUR_Z, is CUR_Z-step_size. Unless this results in a value of Z less than or equal to TGT_Z (in which case Z preferably is set at step 208 to TGT_Z and the method ends at 209), the new value of Z preferably is again maintained at step 210 for the period defined by the step length. The value of Z preferably is then again decreased by step_size (in the second step having the value CUR_Z-step_size-step_size unless that is below TGT_Z as discussed above), and the new value again lasts for a step length interval. This continues iteratively, until the value of Z as reduced is less than or equal to TGT_Z, in which case the method ends and Z is set equal to TGT_Z.

Figure 3:
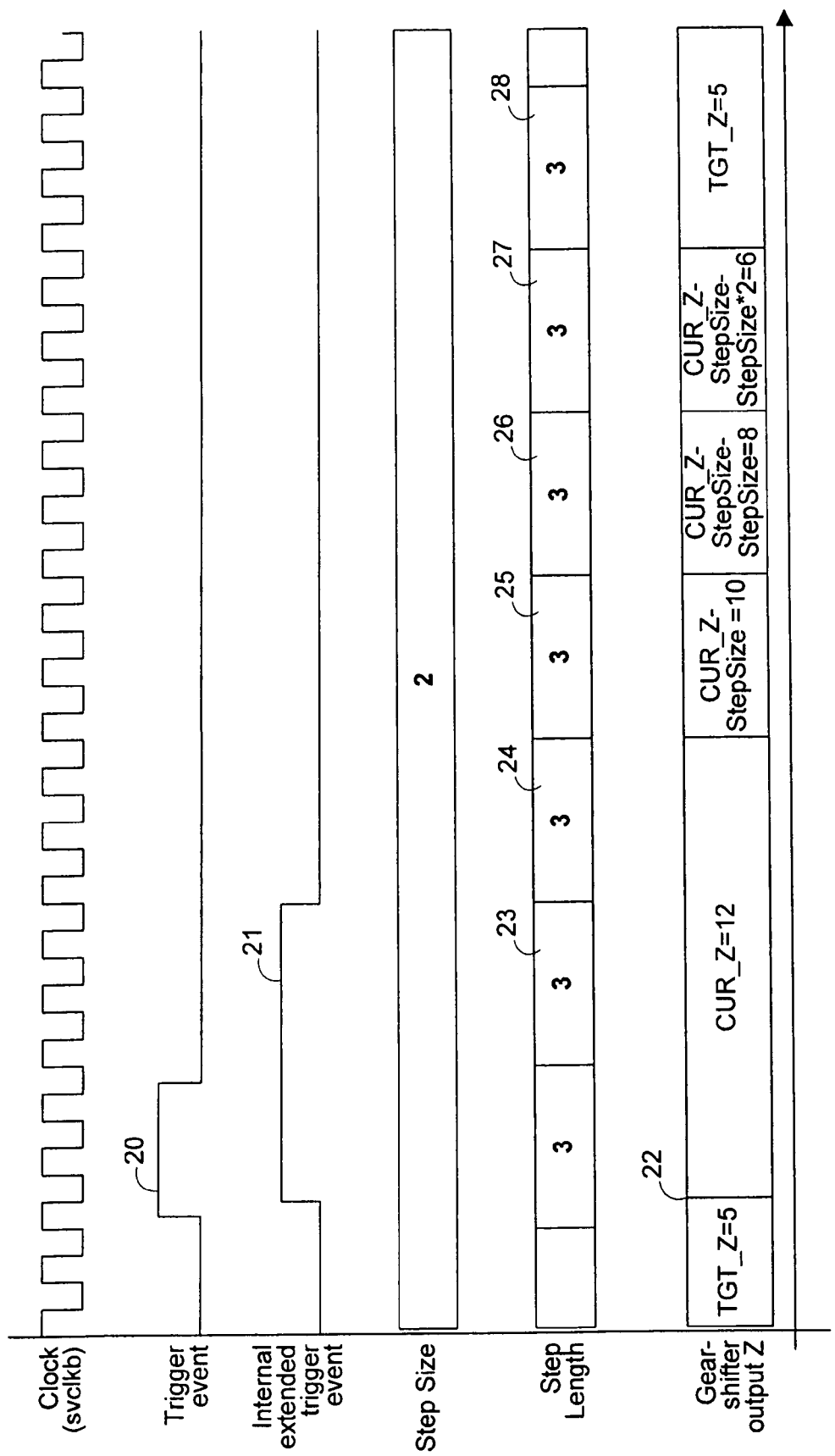
FIG. 3 is a timing diagram illustrating the method of FIG. 2.

This preferred method is illustrated by the timing diagrams of FIG. 3. In this example, step size is set to 2, step length is set to 3, TGT_Z is set to 5 and CUR_Z is set to 12. It should be remembered, however, that for different types of trigger events, the variables, or at least step size and step length, may be set to different values, and may not remain constant during execution of the method, as described above.

As seen in FIG. 3, on the occurrence of trigger event 20, an internal extended trigger event signal 21 is generated. This is done because the trigger event is unpredictable and may have different durations. In this example, extended trigger event signal 21 lasts three clock cycles beyond the end of trigger event 20. (Note that trigger event 20 is asynchronous; therefore it is shown with edges that do not coincide with clock edges, although by happenstance one or both edges may coincide with clock edges.) At the same time, at 22, the value of Z is increased from TGT_Z (a user-programmable value which in this example is equal to 5) to CUR_Z (a user-programmable value which is equal to 12 in this example), where it remains until the end of the step length interval 24 following the step length interval 23 during which the extended trigger event 21 ends. In each of the next three step length intervals 25, 26, 27, the value of Z is decreased in steps having step size equal to 2, so that at the end of interval 27, Z=6. In interval 28, a further reduction by 2 would result in Z=4, which is less than TGT_Z (5), and so Z is set to TGT_Z=5.

Preferably, the method according to this invention is implemented on both the data and servo channels of a disk drive controller. The method may be triggered by various different events such as an auto-zero event or a thermal asperity. The values of the various variables can be different for different types of events.

Figure 9:
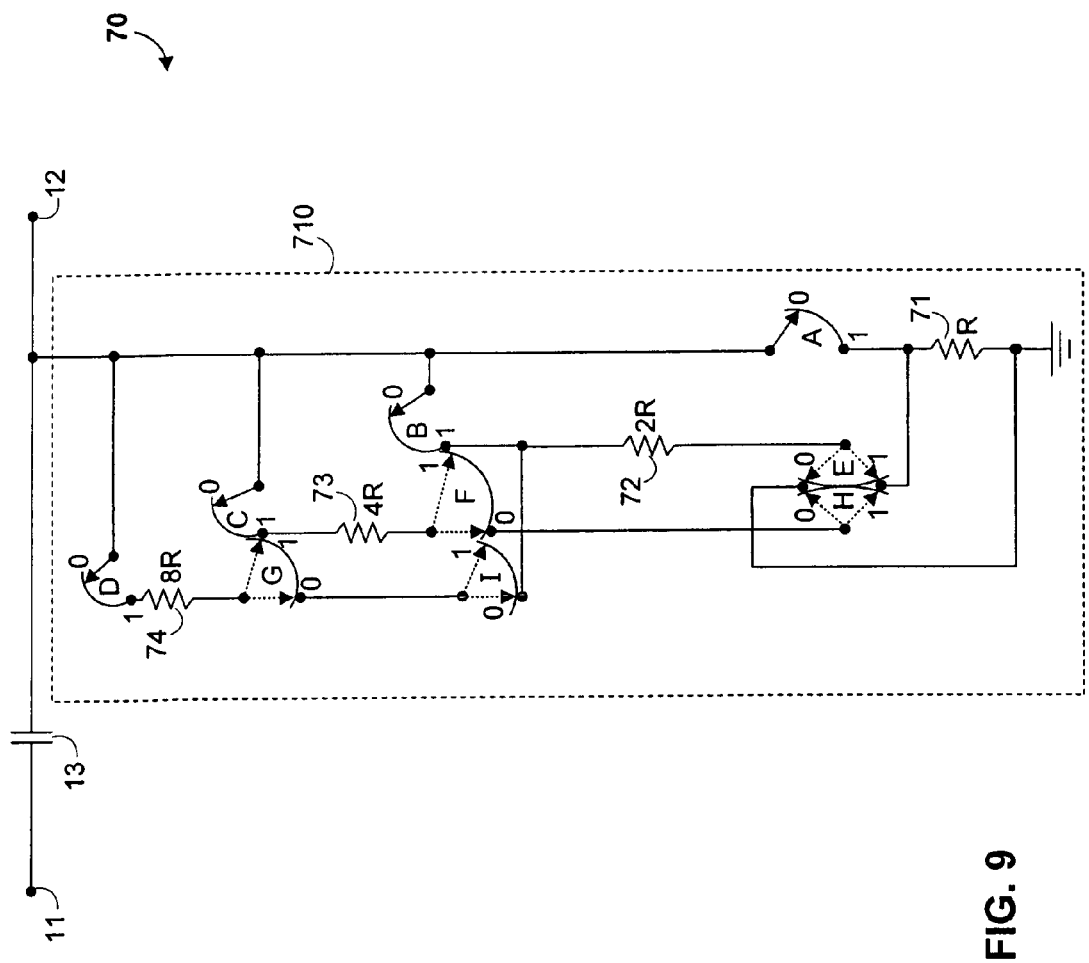
FIG. 9 is a schematic diagram of an exemplary filter circuit that can be used with the present invention.

FIGS. 4-8 show a preferred embodiment of logic circuitry for carrying out the method of the invention. Logic circuitry 300 provides a 4-bit output 31 labelled FINAL_Z. FIG. 9, discussed below, is an example of filter circuitry 70 including circuitry 710 that translates FINAL_Z into fifteen resistance steps (R=0 is not used).

Figure 4:
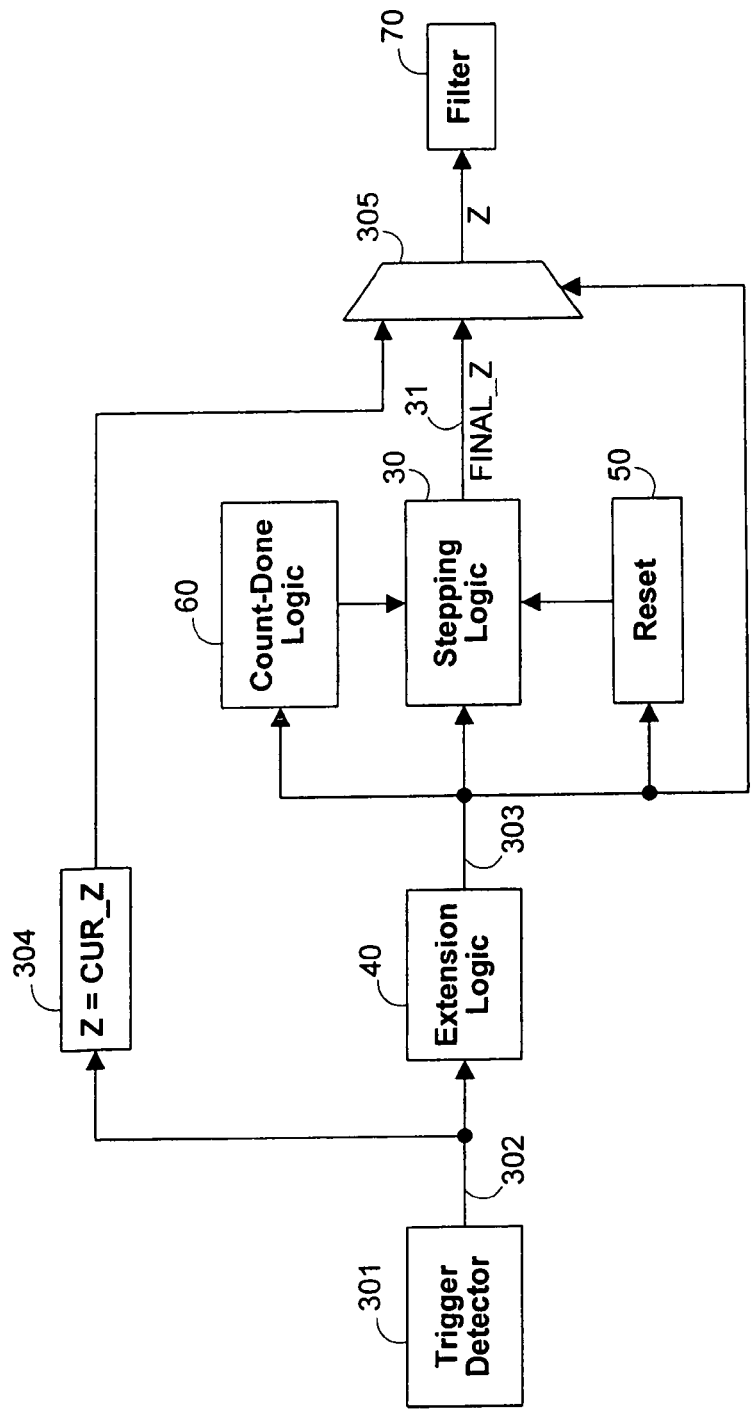
FIG. 4 is a schematic diagram of a preferred embodiment of circuitry according to the present invention for carrying out the method according to the invention.

As seen in FIG. 4, trigger detector 301 generates signal 302 that causes extension logic 40 (FIG. 6) to generate an extended trigger signal 303 upon occurrence of a trigger event. Signal 303 is used by stepping logic 30 (FIG. 5), count-done logic 60 (FIG. 8) and reset logic 50 (FIG. 7) to step down FINAL_Z output signal 31 to control the cut-off frequency of filter 70. Signal 302 also causes Z to be set to relatively high value CUR_Z at 304. Signal 303 also controls multiplexer 305 which determines whether CUR_Z or FINAL_Z determines the cut-off frequency of filter 70.

Figure 5:
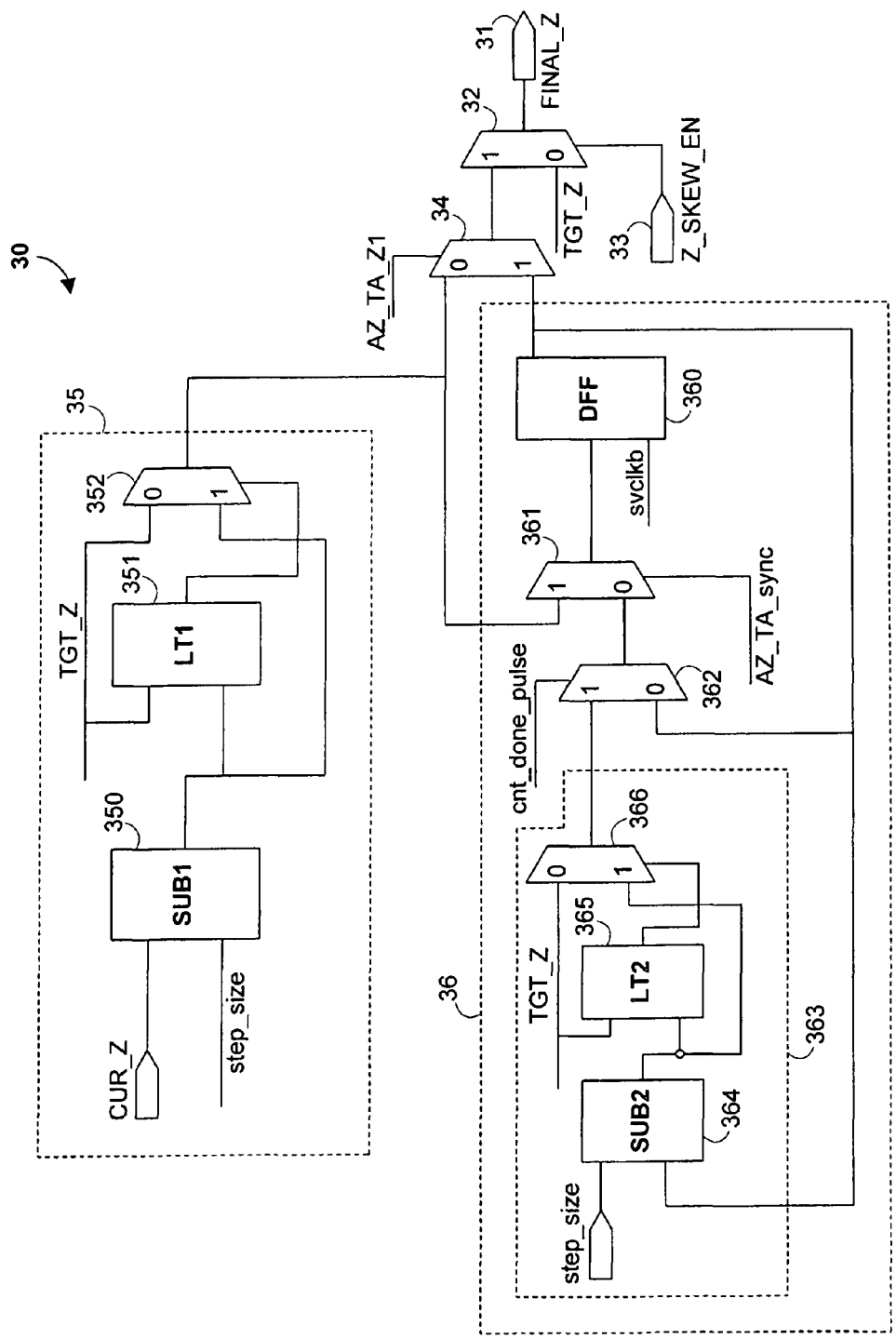
FIG. 5 is a schematic diagram of a preferred embodiment of step-down logic of the circuitry of FIG. 4.
Figure 6:
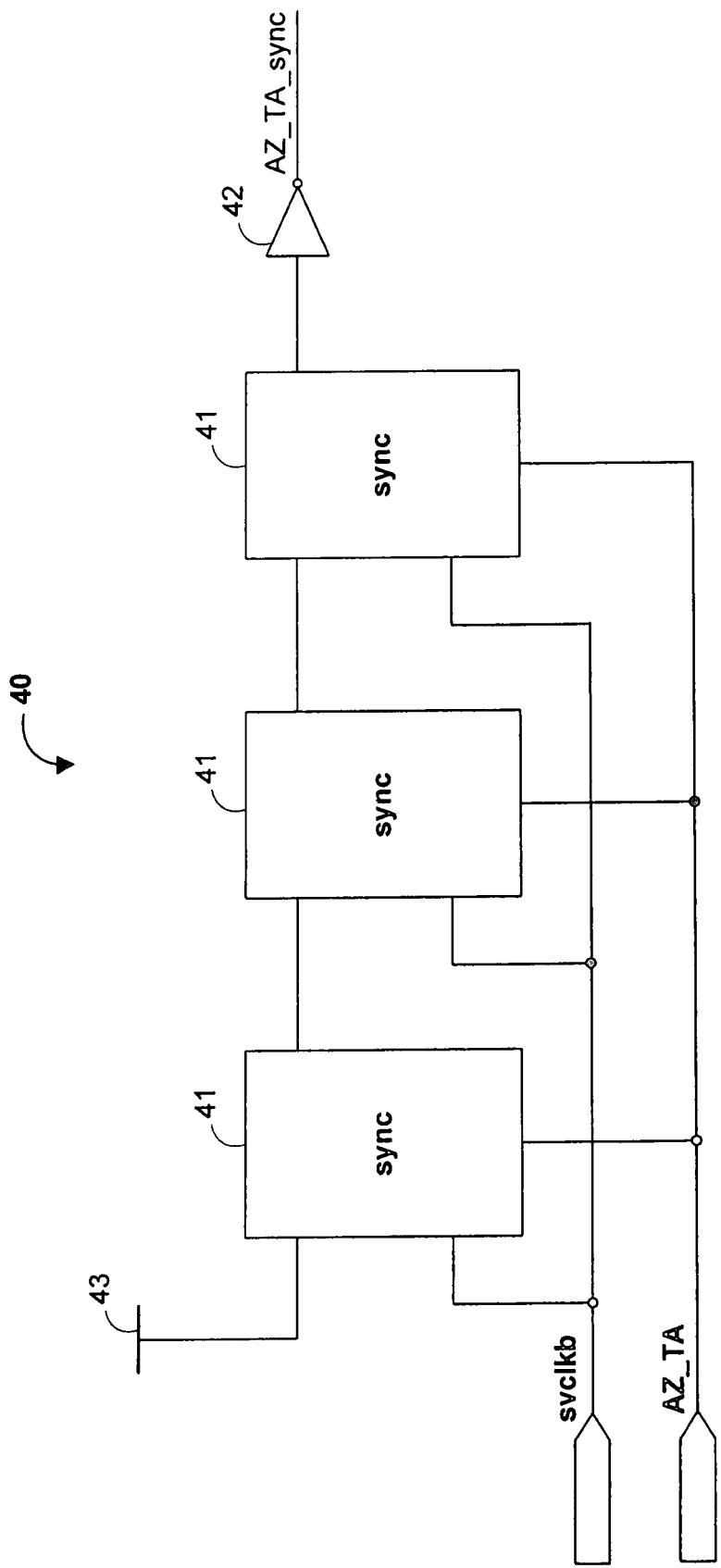
FIG. 6 is a schematic diagram of a preferred embodiment of circuitry for generating the extended trigger event signal shown in FIG. 3.
Figure 7:
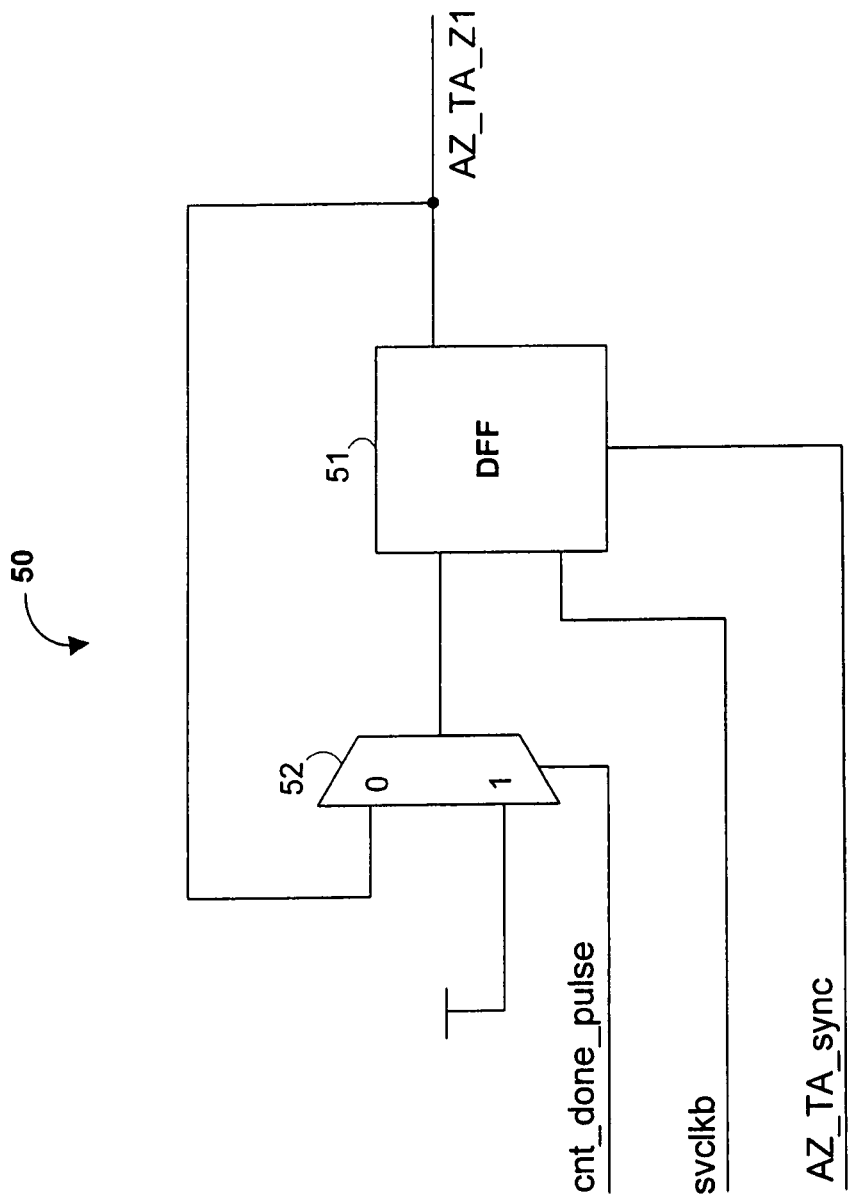
FIG. 7 is a schematic diagram of a preferred embodiment of circuitry for resetting the circuitry of FIG. 4 on the occurrence of an additional trigger event.
Figure 8:
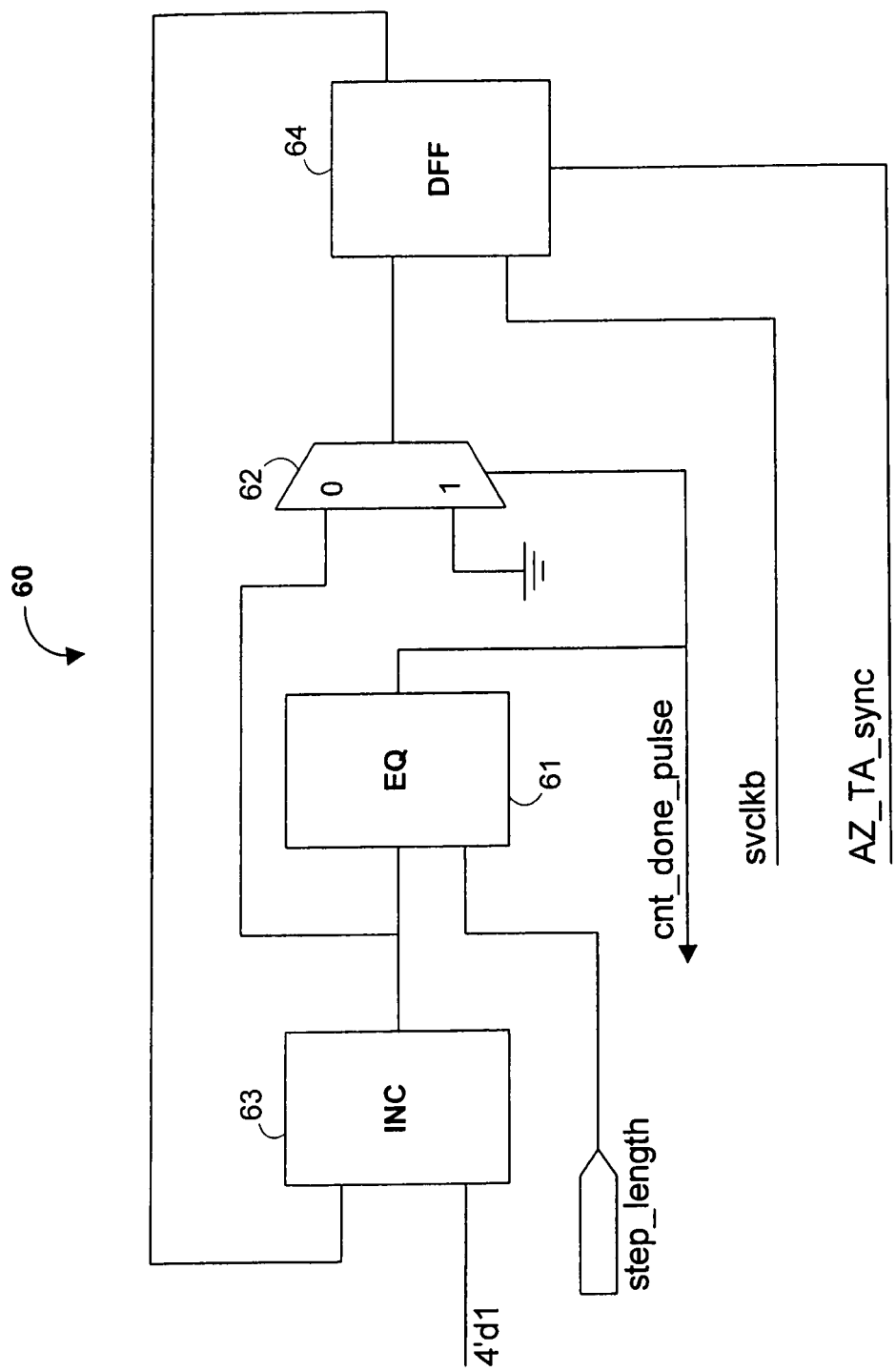
FIG. 8 is a schematic diagram of a preferred embodiment of circuitry for generating the count-done pulse used in the circuitry of FIG. 4.

As seen in FIG. 5, which represents stepping logic 30, output 31 is provided by multiplexer 32, under the control of Z_SKEW_EN enable signal 33. If enable signal 33 is not asserted, multiplexer 32 simply outputs TGT_Z immediately, without the gradual step-down according to the invention, but if signal 33 is asserted, then multiplexer 32 outputs the output of multiplexer 34.

Multiplexer 34 is controlled by the signal AZ_TA_Z1 (output by circuitry 50 of FIG. 7), which is a reset signal that resets the circuitry in the event that a new trigger event occurs during step-down (because on occurrence of a new trigger event, care must be taken that the cut-of frequency does not decrease too quickly, just as on the occurrence of the original event). In circuitry 50 flip-flop 51 maintains its output unless reset by extended trigger event signal AZ_TA_sync (signal 303, above) that is generated by circuitry 40 of FIG. 6. Circuitry 40 preferably is a chain of three flip-flops 41 followed by inverter 42. On occurrence of the actual trigger event signal AZ_TA (signal 302, above), flip-flops 41 are reset to zero, driving AZ_TA_sync (i.e., the output of inverter 42) high. Once the actual trigger event signal AZ_TA is removed, or returns to zero, it will take a number of clock cycles equal to the number of flip-flops 41 (in this example, three clock cycles) for input 43 to propagate through circuitry 40 and return the extended trigger signal AZ_TA_sync to zero.

Returning to FIG. 7, as long as the AZ_TA_sync signal is high, AZ_TA_Z1 will be low. Once AZ_TA_sync goes low (after the end of the extended trigger event), flip-flop 51 will maintain its output low, unless there is another trigger event or when the cnt_done_pulse signal generated by circuitry 60 of FIG. 8 indicates that a step has been completed, and changes the selection of multiplexer 52.

In circuitry 60, the cnt_done_pulse signal is output by comparator 61, and the signal also controls multiplexer 62. As long as the cnt_done_pulse signal remains low, multiplexer 62 outputs the output of counter 63, and feeds it back on the next clock cycle through flip-flop 64 to counter 63, where it is incremented by 1 and input to both comparator 61 and multiplexer 62. Comparator 61 compares that signal to the pre-programmed step length (or the step length appropriate to the type of event if there is more than one step length) and as soon as they are equal, asserts the cnt_done_pulse signal which zeroes the output of multiplexer 62, in turn zeroing flip-flop 64 and resetting counter 63. Flip-flop 64 (and thus counter 63) may also be reset by a new trigger event via the AZ_TA_sync signal. The cnt_done_pulse signal also controls AZ_TA_Z1, as discussed above. Once cnt_done_pulse goes high, AZ_TA_Z1 will remain high until AZ_TA_sync goes low (i.e., until a new trigger event).

Returning to FIG. 5, if AZ_TA_Z1 is low, meaning there has been a recent trigger event which has caused Z to be increased to CUR_Z, but the step length counter 63 has not counted a full step length since the end of that trigger event, then multiplexer 34 selects the output of circuit block 35 which outputs the first reduced step Z=CUR_Z-step_size. Specifically, circuit block 35 includes a subtractor 350 that accepts as inputs the programmed values of CUR_Z and step_size, and outputs the difference CUR_Z-step_size. That difference is input into a comparator 351 and also into a multiplexer 352. The programmed value TGT_Z also is input into comparator 351 and multiplexer 352. The output of comparator 351, which is high if TGT_Z is less than CUR_Z-step_size and low if TGT_Z is greater than or equal to CUR_Z-step_size, is the control signal for multiplexer 352. If TGT_Z<CUR_Z-step_size, multiplexer 352 selects CUR_Z-step_size; if TGT_Z>CUR_Z-step_size, multiplexer 352 selects TGT_Z. In other words, CUR_Z-step_size is selected unless it would be too low, in which case TGT_Z is selected. The selected value is thus "pre-calculated" and ready for output as soon as the extended trigger period ends.

If AZ_TA_Z1 is high, meaning that the step length counter 63 has already counted a full step length since the end of the last trigger event (AZ_TA_Z1 will then stay high until (1) the next trigger event occurs and (2) AZ_TA_sync (a) goes high and then (b) goes low again), then multiplexer 34 selects the output of circuit block 36.

The output of circuit block 36 is the output of flip-flop 360 which registers the output until a clock edge occurs. The input of flip-flop 360 is the output of multiplexer 361 which, under control of AZ_TA_sync, outputs either the output of block 35 (which is CUR_Z-step_size) or the output of multiplexer 362. If AZ_TA_sync is high (i.e., during the extended trigger event), the output of block 35 is selected; if AZ_TA_sync is low (i.e., all other times), the output of multiplexer 362 is selected.

The output of multiplexer 362 is either the previous output of flip-flop 360 as fed back to multiplexer 362, or the output of sub-block 363. The output of sub-block 363 is the previous output of flip-flop 360 as fed back to subtractor 364 and decremented by step_size, unless that difference is less than TGT_Z as determined by comparator 365 and multiplexer 366 in which case the output is TGT_Z. The previous output is used by multiplexer 362 between assertions of cnt_done_pulse (i.e., within a single step length interval), while the output of sub-block 363 is used upon each assertion of cnt_done_pulse. Thus, within a step length interval, the output of flip-flop 360 does not change, but at the end of each step length interval, the output is decremented by step_size (with a floor of TGT_Z).

The output 31, FINAL_Z, of stepping logic circuitry 30 is preferably a four-bit binary number that controls a resistance selection circuit. Thus, the step_size referred to above is a step in the value of FINAL_Z. However, the value of FINAL_Z has to be translated into an actual physical resistance, with a resolution at least as fine as step_size, in which each increase by one in the value of FINAL_Z represents one-sixteenth of the total range of the physical resistance. One way of accomplishing that result is the resistor network 710 of filter 70 shown in FIG. 9.

In resistor network 710, resistor 71 has a basic resistance value R, resistor 72 has a resistance 2R twice the basic resistance value, resistor 73 has a resistance 4R four times the basic resistance value, and resistor 74 has a resistance 8R eight times the basic resistance value. It is readily seen that each of resistors 71, 72, 73, 74 corresponds to a bit of the 4-bit value of Z (or FINAL_Z). Thus, for any binary value of Z between 0001 and 1111 (i.e., any decimal value of Z between 1 and 15), network 710 can provide a resistance equal to Z times the basic resistance value. Of course, unless step_size=1, not all possible resistance values will be used. Network 710 also includes eight switches identified as A-I, each having two positions identified as 0 and 1. Switches A-D are single-throw switches in which position 0 is the open position and position 1 is the closed position. Switches E-I are double-throw switches in which each of positions 0 and 1 is a different closed position. The following table shows how various positions of switches A-I provide the various resistances from R to 15R where R is the basic resistance value of resistor 71, where "X" means "don't care":

| Resistance | Switch | | | | | | | | |
|---|---|---|---|---|---|---|---|---|---|
| | A | B | C | D | E | F | G | H | I |
| R   | 1 | 0 | 0 | 0 | X | X | X | X | X |
| 2R  | 0 | 1 | 0 | 0 | X | X | X | X | X |
| 3R  | 0 | 1 | 0 | 0 | 1 | X | X | X | X |
| 4R  | 0 | 0 | 1 | 0 | X | 0 | X | 0 | X |
| 5R  | 0 | 0 | 1 | 0 | X | 0 | X | 1 | X |
| 6R  | 0 | 0 | 1 | 0 | 0 | 1 | X | X | X |
| 7R  | 0 | 0 | 1 | 0 | 1 | 1 | X | X | X |
| 8R  | 0 | 0 | 0 | 1 | X | X | 0 | 0 | 1 |
| 9R  | 0 | 0 | 0 | 1 | X | X | 0 | 1 | 1 |
| 10R | 0 | 0 | 0 | 1 | 0 | X | 0 | X | 0 |
| 11R | 0 | 0 | 0 | 1 | 1 | X | 0 | X | 0 |
| 12R | 0 | 0 | 0 | 1 | X | 0 | 1 | 0 | X |
| 13R | 0 | 0 | 0 | 1 | X | 0 | 1 | 1 | X |
| 14R | 0 | 0 | 0 | 1 | 0 | 1 | 1 | X | X |
| 15R | 0 | 0 | 0 | 1 | 1 | 1 | 1 | X | X |

In the example above, step_size=2, so not all fifteen resistance values would have been used, but in another implementation, or in the same implementation but for a different type of trigger event, a value of step_size other than 2 is possible.

It will be understood that an equivalent arrangement can be implemented with a plurality of capacitors in parallel, which can be combined with a resistor to form the filter circuit. As capacitors in parallel are additive, the desired capacitance, and therefore frequency, could be achieved by simply having a switch in series with each parallel capacitor, for switching a particular capacitor into or out of the parallel arrangement.

Thus it is seen that a method and circuitry to change the cut-off frequency of a filter gradually, and therefore without giving rise to false signals, has been provided.

Referring now to FIGS. 10-16, exemplary implementations of the present invention are shown.

Figure 10:
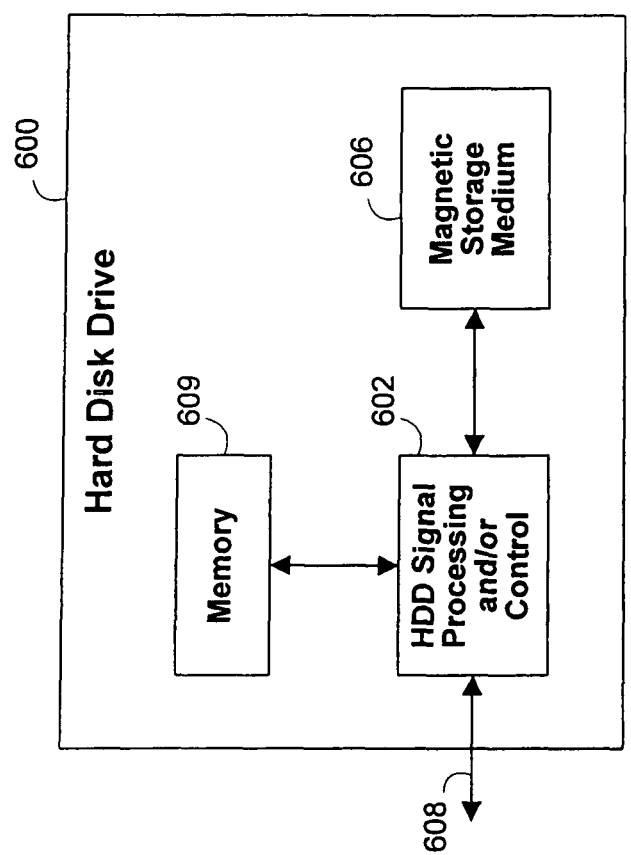
FIG. 10 is a block diagram of an exemplary hard disk drive that can employ the disclosed technology.

Referring now to FIG. 10 the present invention can be implemented in a hard disk drive 600. The present invention may implement either or both signal processing and/or control circuits, which are generally identified in FIG. 10 at 602. In some implementations, the signal processing and/or control circuit 602 and/or other circuits (not shown) in the HDD 600 may process data, perform coding and/or encryption, perform calculations, and/or format data that is output to and/or received from a magnetic storage medium 606.

The HDD 600 may communicate with a host device (not shown) such as a computer, mobile computing devices such as personal digital assistants, cellular telephones, media or MP3 players and the like, and/or other devices, via one or more wired or wireless communication links 608. The HDD 600 may be connected to memory 609 such as random access memory (RAM), low latency nonvolatile memory such as flash memory, read only memory (ROM) and/or other suitable electronic data storage.

Figure 11:
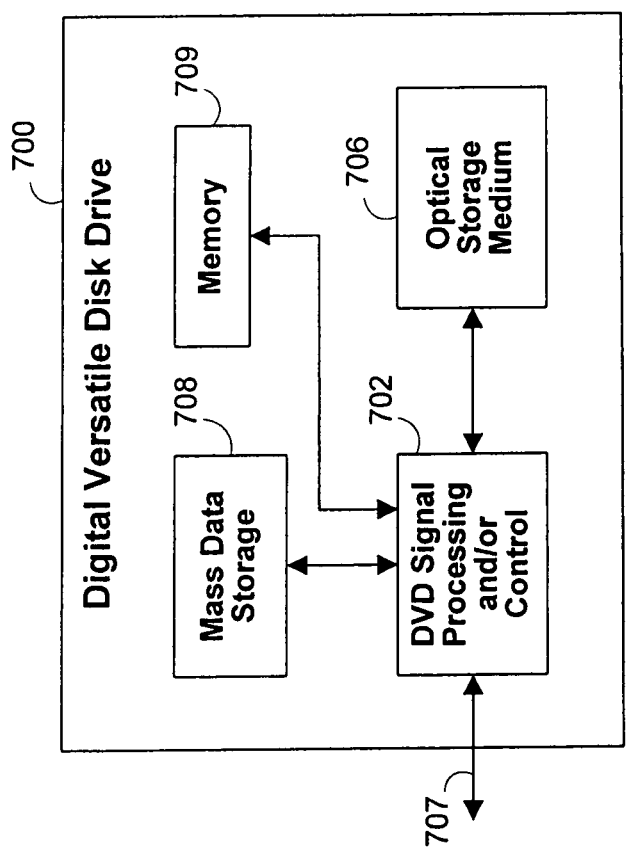
FIG. 11 is a block diagram of an exemplary digital versatile disk drive that can employ the disclosed technology.

Referring now to FIG. 11 the present invention can be implemented in a digital versatile disk (DVD) drive 700. The present invention may implement either or both signal processing and/or control circuits, which are generally identified in FIG. 11 at 712, and/or mass data storage of the DVD drive 700. The signal processing and/or control circuit 712 and/or other circuits (not shown) in the DVD drive 700 may process data, perform coding and/or encryption, perform calculations, and/or format data that is read from and/or data written to an optical storage medium 716. In some implementations, the signal processing and/or control circuit 712 and/or other circuits (not shown) in the DVD drive 700 can also perform other functions such as encoding and/or decoding and/or any other signal processing functions associated with a DVD drive.

DVD drive 700 may communicate with an output device (not shown) such as a computer, television or other device, via one or more wired or wireless communication links 717. The DVD drive 700 may communicate with mass data storage 718 that stores data in a nonvolatile manner. The mass data storage 718 may include a hard disk drive (HDD). The HDD may have the configuration shown in FIG. 10 The HDD may be a mini-HDD that includes one or more platters having a diameter that is smaller than approximately 1.8". The DVD drive 700 may be connected to memory 719 such as RAM, ROM, low-latency nonvolatile memory such as flash memory, and/or other suitable electronic data storage.

Figure 12:
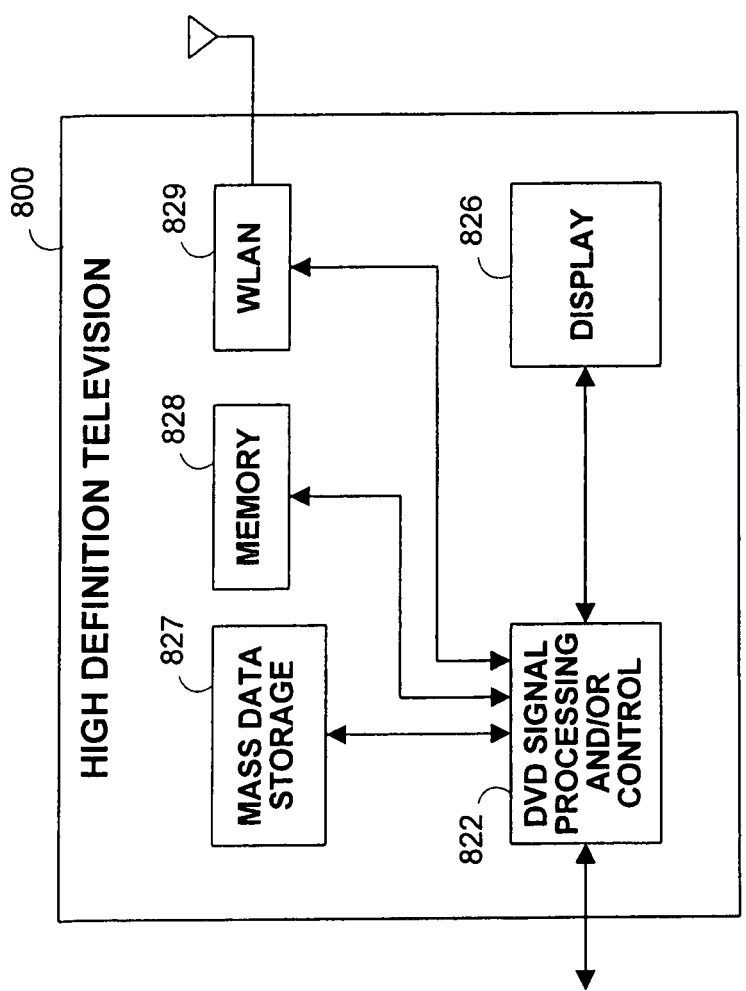
FIG. 12 is a block diagram of an exemplary high definition television that can employ the disclosed technology.

Referring now to FIG. 12, the present invention can be implemented in a high definition television (HDTV) 800.

The present invention may implement either or both signal processing and/or control circuits, which are generally identified in FIG. 12 at 822, a WLAN interface and/or mass data storage of the HDTV 800. The HDTV 800 receives HDTV input signals in either a wired or wireless format and generates HDTV output signals for a display 826. In some implementations, signal processing circuit and/or control circuit 822 and/or other circuits (not shown) of the HDTV 820 may process data, perform coding and/or encryption, perform calculations, format data and/or perform any other type of HDTV processing that may be required.

The HDTV 800 may communicate with mass data storage 827 that stores data in a nonvolatile manner such as optical and/or magnetic storage devices. At least one HDD may have the configuration shown in FIG. 10 and/or at least one DVD drive may have the configuration shown in FIG. 11. The HDD may be a mini-HDD that includes one or more platters having a diameter that is smaller than approximately 1.8". The HDTV 800 may be connected to memory 1028 such as RAM, ROM, low-latency nonvolatile memory such as flash memory, and/or other suitable electronic data storage. The HDTV 800 also may support connections with a WLAN via a WLAN network interface 829.

Figure 13:
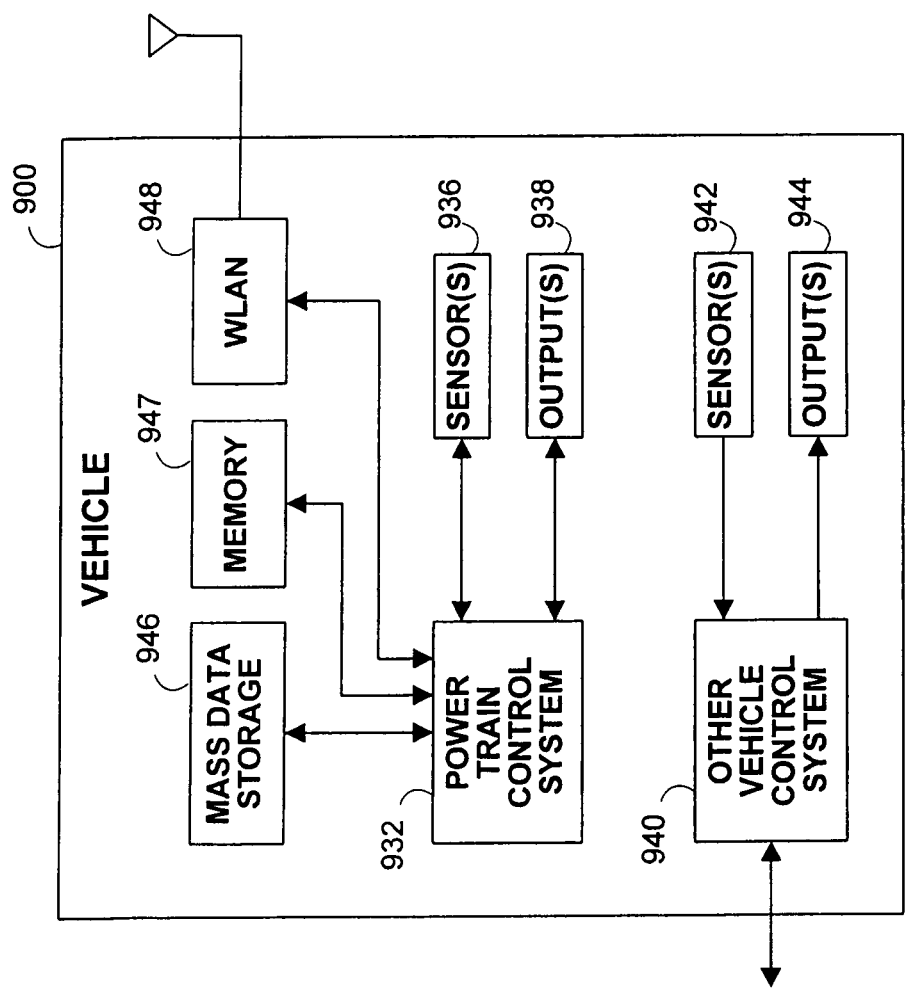
FIG. 13 is a block diagram of an exemplary vehicle that can employ the disclosed technology.

Referring now to FIG. 13, the present invention implements a control system of a vehicle 900, a WLAN interface and/or mass data storage of the vehicle control system. In some implementations, the present invention may implement a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 940 of the vehicle 900. The control system 940 may likewise receive signals from input sensors 942 and/or output control signals to one or more output devices 944. In some implementations, the control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 932 may communicate with mass data storage 946 that stores data in a nonvolatile manner. The mass data storage 946 may include optical and/or magnetic storage devices for example hard disk drives HDD and/or DVDs. At least one HDD may have the configuration shown in FIG. 10 and/or at least one DVD drive may have the configuration shown in FIG. 11. The HDD may be a mini-HDD that includes one or more platters having a diameter that is smaller than approximately 1.8". The powertrain control system 932 may be connected to memory 947 such as RAM, ROM, low latency nonvolatile memory such as flash memory, and/or other suitable electronic data storage. The powertrain control system 932 also may support connections with a WLAN via a WLAN network interface 948. The control system 940 may also include mass data storage, memory and/or a WLAN interface (none shown).

Figure 14:
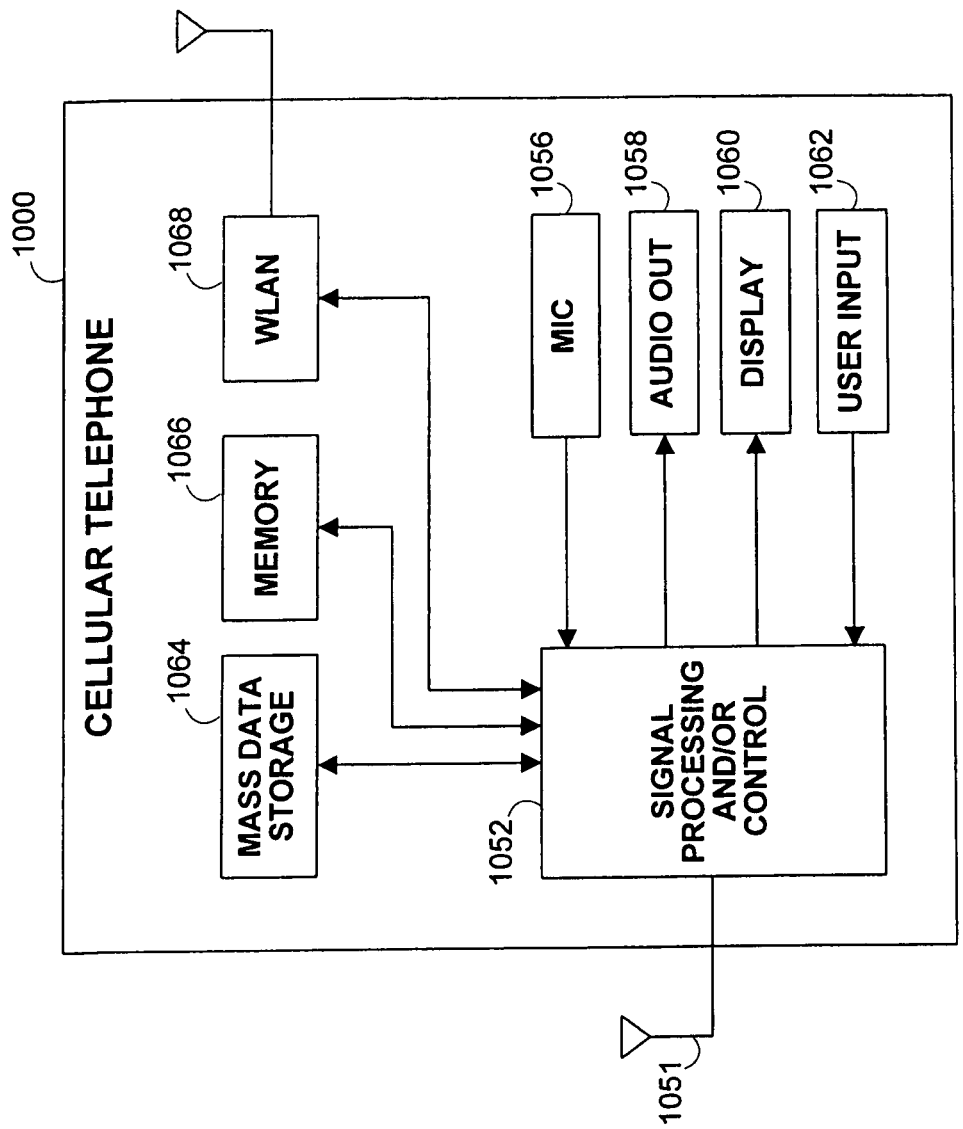
FIG. 14 is a block diagram of an exemplary cellular telephone that can employ the disclosed technology.

Referring now to FIG. 14, the present invention can be implemented in a cellular telephone 1000 that may include a cellular antenna 1051. The present invention may implement either or both signal processing and/or control circuits, which are generally identified in FIG. 14 at 1052, a WLAN interface and/or mass data storage of the cellular phone 1050. In some implementations, the cellular telephone 1050 includes a microphone 1056, an audio output 1058 such as a speaker and/or audio output jack, a display 1060 and/or an input device 1062 such as a keypad, pointing device, voice actuation and/or other input device. The signal processing and/or control circuits 1052 and/or other circuits (not shown) in the cellular telephone 1050 may process data, perform coding and/or encryption, perform calculations, format data and/or perform other cellular telephone functions.

The cellular telephone 1050 may communicate with mass data storage 1064 that stores data in a nonvolatile manner such as optical and/or magnetic storage devices—for example hard disk drives (HDDs) and/or DVDs. At least one HDD may have the configuration shown in FIG. 10 and/or at least one DVD drive may have the configuration shown in FIG. 11. The HDD may be a mini-HDD that includes one or more platters having a diameter that is smaller than approximately 1.8". The cellular telephone 1000 may be connected to memory 1066 such as RAM, ROM, low-latency nonvolatile memory such as flash memory, and/or other suitable electronic data storage. The cellular telephone 1000 also may support connections with a WLAN via a WLAN network interface 1068.

Figure 15:
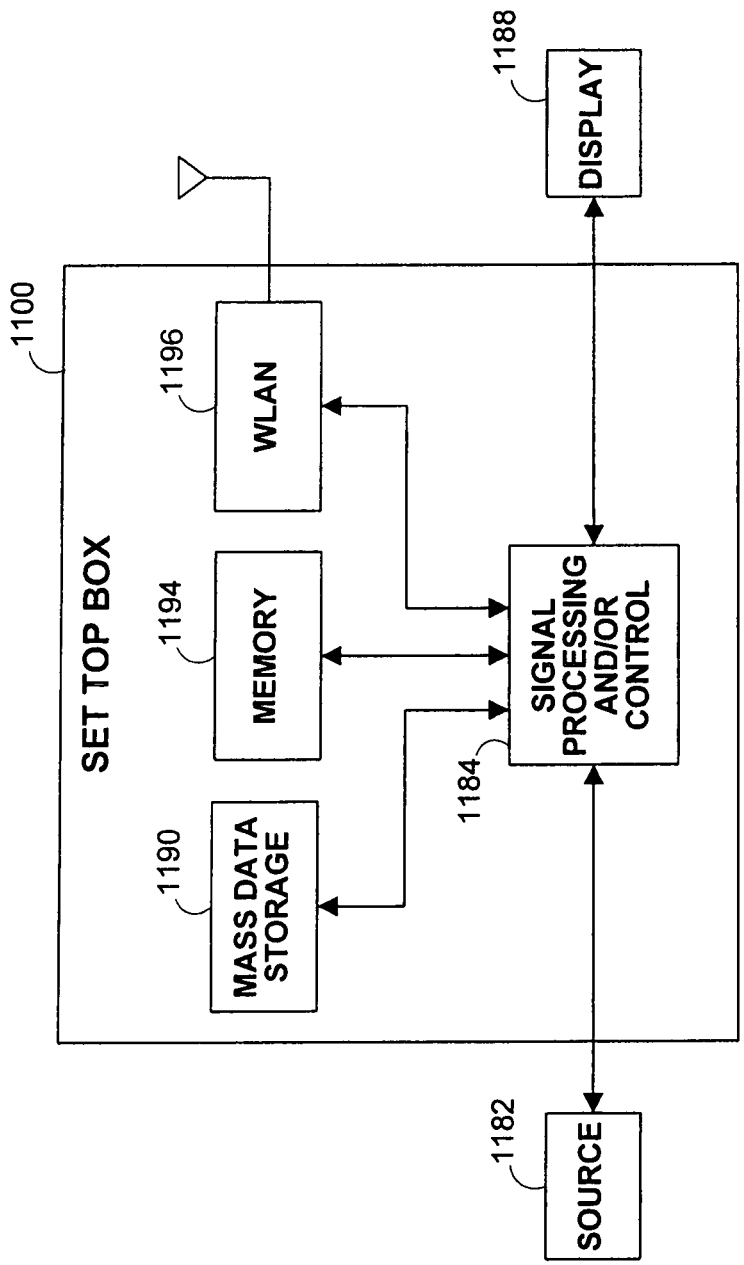
FIG. 15 is a block diagram of an exemplary set top box that can employ the disclosed technology.

Referring now to FIG. 15, the present invention can be implemented in a set top box 1100. The present invention may implement either or both signal processing and/or control circuits, which are generally identified in FIG. 15 at 1184, a WLAN interface and/or mass data storage of the set top box 1180. Set top box 1180 receives signals from a source 1182 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1180 may process data, perform coding and/or encryption, perform calculations, format data and/or perform any other set top box function.

Set top box 1100 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 10 and/or at least one DVD drive may have the configuration shown in FIG. 11. The HDD may be a mini-HDD that includes one or more platters having a diameter that is smaller than approximately 1.8". Set top box 1100 may be connected to memory 1194 such as RAM, ROM, low-latency nonvolatile memory such as flash memory, and/or other suitable electronic data storage. Set top box 1100 also may support connections with a WLAN via a WLAN network interface 1196.

Figure 16:
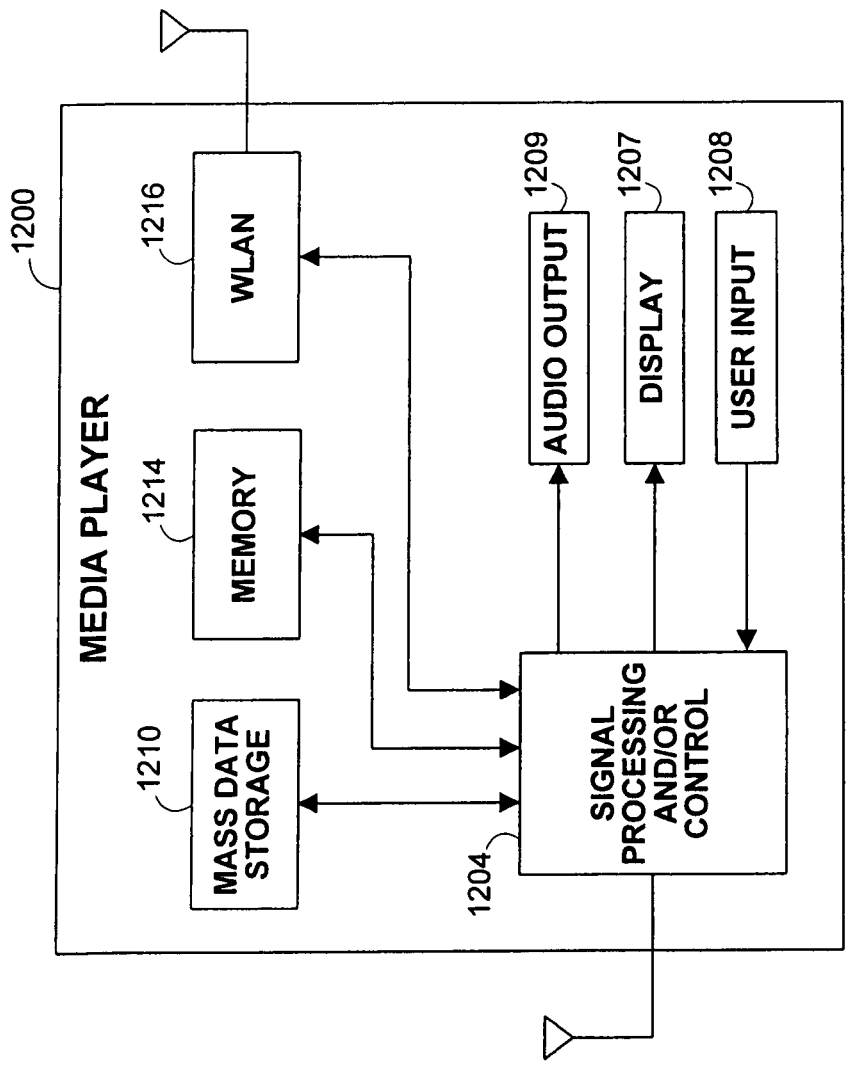
FIG. 16 is a block diagram of an exemplary media player that can employ the disclosed technology.

Referring now to FIG. 16, the present invention can be implemented in a media player 1200. The present invention may implement either or both signal processing and/or control circuits, which are generally identified in FIG. 16 at 1204, a WLAN interface and/or mass data storage of the media player 1200. In some implementations, the media player 1200 includes a display 1207 and/or a user input 1208 such as a keypad, touchpad and the like. In some implementations, the media player 1200 may employ a graphical user interface (GUI) that typically employs menus, drop down menus, icons and/or a point-and-click interface via the display 1207 and/or user input 1208. Media player 1200 further includes an audio output 1209 such as a speaker and/or audio output jack. The signal processing and/or control circuits 1204 and/or other circuits (not shown) of media player 1200 may process data, perform coding and/or encryption, perform calculations, format data and/or perform any other media player function.

Media player 1200 may communicate with mass data storage 1210 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 10 and/or at least one DVD drive may have the configuration shown in FIG. 11. The HDD may be a mini-HDD that includes one or more platters having a diameter that is smaller than approximately 1.8". Media player 1200 may be connected to memory 1214 such as RAM, ROM, low-latency nonvolatile memory such as flash memory, and/or other suitable electronic data storage. Media player 1200 also may support connections with a WLAN via a WLAN network interface 1216. Still other implementations in addition to those described above are contemplated.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for varying cut-off frequency of a filter when a steady state is disturbed, said method comprising:
    detecting a trigger event that disturbs said steady state;
    in response to said trigger event, changing a value of a circuit element of said filter to an initial value to raise said cut-off frequency from a steady-state target frequency to an initial frequency;
    maintaining said initial value of said circuit element to maintain said cut-off frequency at said initial frequency for a predetermined period after said trigger event;
    after said predetermined period, comparing a difference, between a current value of said circuit element and a step size, to a target value of said circuit element corresponding to said target frequency; and:
    (1) when said difference is less than said target value of said circuit element, setting said value of said circuit element to said target value of said circuit element and resuming said steady state, and otherwise:
    (2)(a) changing said value of said circuit element by said step size to a new value to reduce said cut-off frequency by a frequency step to a new frequency,
    (b) maintaining said new value of said circuit element to maintain said new frequency for an interval equal to a step length, and
    (c) after said interval, repeating said comparing, said changing and said maintaining until, in said comparing, said difference is less than said target value of said circuit element and then performing said setting said value of said circuit element corresponding to said target value of said circuit element and resuming said steady state.

2. The method of claim 1 wherein said changing comprises decreasing.

3. The method of claim 1 wherein:
    said cutoff frequency is determined by a resistance and a capacitance; and
    said changing comprises adjusting said resistance.

4. The method of claim 1 wherein:
    said cutoff frequency is determined by a resistance and a capacitance; and
    said changing comprises adjusting said capacitance.

5. The method of claim 1 further comprising setting said step size to set said frequency step.

6. The method of claim 5 wherein said step size, once set, is constant.

7. The method of claim 5 further comprising varying said step size during said repeating.

8. The method of claim 1 further comprising setting said step length.

9. The method of claim 8 wherein said step length, once set, is constant.

10. The method of claim 8 further comprising varying said step length during said repeating.

11. The method of claim 1 wherein said filter is a high-pass filter.

12. The method of claim 11 wherein said changing comprises decreasing.

13. The method of claim 1 wherein said filter is a band-pass filter.

14. The method of claim 13 wherein:
    said cut-off frequency defines a lower limit of a passband of said band-pass filter; and
    said changing comprises decreasing said value of said circuit element to decrease said lower limit of said passband.

15. A filter having a variable cut-off frequency that operates in a steady state at a steady-state target frequency, said filter comprising:
    means for detecting a trigger event that disturbs said steady state;
    means for, in response to said trigger event, changing a value of a circuit element of said filter to an initial value to raise said cut-off frequency from said target frequency to an initial frequency;
    means for maintaining said initial value of said circuit element to maintain said cut-off frequency at said initial frequency for a predetermined period after said trigger event; and
    means for, after said predetermined period, comparing a difference, between a current value of said circuit element and a step size, to a target value of said circuit element corresponding to said target frequency; and:
    (1) when said difference is less than said target value of said circuit element, setting said value of said circuit element to said target value of said circuit element and resuming said steady state, and otherwise:
    (2)(a) changing said value of said circuit element by a step size to a new value to reduce said cut-off frequency by a frequency step to a new frequency,
    (b) maintaining said new value of said circuit element to maintain said new frequency for an interval equal to a step length, and
    (c) after said interval, repeating said comparing, said changing and said maintaining until, in said comparing, said difference is less than said target value of said circuit element and then performing said setting said value of said circuit element corresponding to said target value of said circuit element and resuming said steady state.

16. The filter of claim 15 wherein said means for changing comprises means for decreasing.

17. The filter of claim 15 wherein:
    said cutoff frequency is determined by a resistance and a capacitance; and
    said means for comparing, setting, maintaining, changing and repeating comprises means for adjusting said resistance.

18. The filter of claim 15 wherein:
    said cutoff frequency is determined by a resistance and a capacitance; and
    said means for comparing, setting, maintaining, changing and repeating comprises means for adjusting said capacitance.

19. The filter of claim 15 further comprising means for setting said step size to set said frequency step.

20. The filter of claim 19 wherein said step size, once set, is constant.

21. The filter of claim 19 wherein, responsive to said means for changing, maintaining, comparing, repeating and setting, said means for setting said frequency step varies said step size during said repeating.

22. The filter of claim 15 further comprising means for setting said step length.

23. The filter of claim 22 wherein said step length, once set, is constant.

24. The filter of claim 22 wherein, responsive to said means for comparing, setting, maintaining, changing and repeating, said means for setting said step length varies said step length during said repeating.

25. The filter of claim 15 wherein said filter is a high-pass filter.

26. The filter of claim 25 wherein said means for comparing, setting, maintaining, changing and repeating comprises means for decreasing said value of said circuit element to decrease said cut-off frequency.

27. The filter of claim 15 wherein said filter is a band-pass filter.

28. The filter of claim 27 wherein:
said cut-off frequency defines a lower limit of a passband of said band-pass filter; and
said means for comparing, setting, maintaining, changing and repeating comprises means for decreasing said value of said circuit element to decrease said lower limit of said passband.

29. A filter having a variable cut-off frequency that operates in a steady state at a steady-state target frequency, said filter comprising:
circuitry to detect a trigger event that disturbs said steady state;
extension logic comprising logic to, in response to said trigger event, change a value of a circuit element of said filter to an initial value to raise said cut-off frequency from said target frequency to said initial frequency, and to maintain said initial value of said circuit element to maintain said cut-off frequency at said initial frequency for a predetermined period after said trigger event; and
stepping logic that, after said predetermined period, compares a difference, between a current value of said circuit element and a step size, to a target value of said circuit element corresponding to said target frequency; and:
(1) when said difference is less than said target value of said circuit element, sets said value of said circuit element to said target value of said circuit element and resuming said steady state, and otherwise:
(2)(a) changes said value of said circuit element by a step size to a new value to reduce said cut-off frequency by a frequency step to a new frequency,
(b) maintains said new value of said circuit element to maintain said new frequency for an interval equal to a step length, and
(c) after said interval, repeats said comparing, said changing and said maintaining until, in said comparing, said difference is less than said target value of said circuit element and then sets said value of said circuit element corresponding to said target value of said circuit element and resumes said steady state.

30. The filter of claim 29 wherein said stepping logic comprises a subtractor to change said value of said circuit element corresponding to said cut-off frequency to said value of said circuit element corresponding to said intermediate frequency by subtracting said step size from said value of said circuit element corresponding to said cut-off frequency.

31. The filter of claim 29 wherein:
said cutoff frequency is determined by a resistance and a capacitance; and
said stepping logic comprises switches to adjust said resistance.

32. The filter of claim 29 wherein:
said cutoff frequency is determined by a resistance and a capacitance; and
said stepping logic comprises switches to adjust said capacitance.

33. The filter of claim 29 further comprising a selector to set said step size.

34. The filter of claim 33 wherein said step size, once set, is constant.

35. The filter of claim 33 wherein, responsive to said stepping logic, said selector varies said step size during said repeating.

36. The filter of claim 29 further comprising a timer to set said step length.

37. The filter of claim 36 wherein said step length, once set, is constant.

38. The filter of claim 36 wherein, responsive to said stepping logic, said timer varies said step length during said repeating.

39. The filter of claim 29 wherein said filter is a high-pass filter.

40. The filter of claim 39 wherein said stepping logic comprises a subtractor to decrease said value of said circuit element corresponding to said cut-off frequency.

41. The filter of claim 29 wherein said filter is a band-pass filter.

42. The filter of claim 41 wherein:
said cut-off frequency defines a lower limit of a passband of said band-pass filter; and
said stepping logic comprises a subtractor that decreases said value of said circuit element corresponding to said lower limit of said passband.

* * * * *